United States Patent
Takahashi et al.

(10) Patent No.: US 7,557,294 B2
(45) Date of Patent: Jul. 7, 2009

(54) SOLAR CELL AND PRODUCTION THEREOF

(75) Inventors: Yasuhito Takahashi, Hirakata (JP); Yukiyoshi Ono, Bunkyo-ku (JP)

(73) Assignee: Panasonic Corporation, Osaka (JP)

( * ) Notice: Subject to any disclaimer, the term of this patent is extended or adjusted under 35 U.S.C. 154(b) by 796 days.

(21) Appl. No.: 10/564,116

(22) PCT Filed: Jan. 12, 2005

(86) PCT No.: PCT/JP2005/000247
§ 371 (c)(1),
(2), (4) Date: Jan. 10, 2006

(87) PCT Pub. No.: WO2005/069386
PCT Pub. Date: Jul. 28, 2005

(65) Prior Publication Data
US 2007/0295396 A1 Dec. 27, 2007

(30) Foreign Application Priority Data
Jan. 13, 2004 (JP) .............................. 2004-005768

(51) Int. Cl.
*H01L 31/00* (2006.01)
(52) U.S. Cl. ...................................... 136/265; 136/264
(58) Field of Classification Search .................. None
See application file for complete search history.

(56) References Cited

U.S. PATENT DOCUMENTS

| 5,948,176 A | 9/1999 | Ramanathan et al. |
| 5,981,868 A | 11/1999 | Kushiya et al. |

(Continued)

FOREIGN PATENT DOCUMENTS

JP  6-97481  4/1994

(Continued)

OTHER PUBLICATIONS

T. Nakada et al., "*Band offset of high efficiency CBD-ZnS/ClGS thin film solar cells*", Thin Solid Films 431-432 (2003), pp. 242-248.

*Primary Examiner*—Alexa D Neckel
*Assistant Examiner*—Miriam Berdichevsky
(74) *Attorney, Agent, or Firm*—Hamre, Schumann, Mueller & Larson, P.C.

(57) ABSTRACT

A solar cell is configured to include: a substrate (21); a conductive film (22) formed on the substrate (21); a compound semiconductor layer (23) formed on the conductive film (22), including a p-type semiconductor crystal containing an element of Group Ib, an element of Group IIIb, and an element of Group VIb; a n-type window layer (24) formed on the compound semiconductor layer (23), having apertures (29); and a n-type transparent conductive film formed on the n-type window layer (24) and on portions of the compound semiconductor layer (23) at the apertures of the n-type window layer (24). The compound semiconductor layer (23) includes high-resistance parts (23B), in portions of the compound semiconductor layer (23) in the vicinity of a surface thereof on a side opposite to the conductive film (22), and the high-resistance parts (23B) contain a n-type impurity doped in the p-type semiconductor crystal. The high-resistance parts (23B) are located under the apertures (29) of the n-type window layer (24), respectively.

20 Claims, 5 Drawing Sheets

U.S. PATENT DOCUMENTS

| | | | |
|---|---|---|---|
| 6,023,020 A * | 2/2000 | Nishitani et al. | 136/255 |
| 6,040,521 A * | 3/2000 | Kushiya et al. | 136/265 |
| 6,259,016 B1 | 7/2001 | Negami et al. | |

FOREIGN PATENT DOCUMENTS

| | | |
|---|---|---|
| JP | 10-74967 | 3/1998 |
| JP | 10-117005 | 5/1998 |
| JP | 10-135498 | 5/1998 |
| JP | 2000-323733 | 11/2000 |
| JP | 2002-343987 | 11/2002 |

* cited by examiner

SOLAR CELL AND PRODUCTION THEREOF

TECHNICAL FIELD

The present invention relates to a solar cell. The present invention particularly relates to a substrate-type solar cell.

BACKGROUND ART

Conventionally, a solar cell of the substrate type has been known, which includes a substrate, a lower electrode formed on the substrate, a light-absorption layer formed on a conductive film, a window layer formed on the light-absorption layer, and an upper electrode formed on the window layer. Further, a solar cell of the substrate type that further includes a buffer layer formed between the light-absorption layer and the window layer has been known.

Regarding the conventional solar cell of the substrate type, more specifically, a configuration has been proposed that includes a glass substrate containing an alkali metal such as Na, a metal film (lower electrode) such as a MO film formed on the glass substrate by sputtering or the like, a chalcopyrite-structured compound semiconductor layer (light-absorption layer) having a p-type conductivity such as a p-type Cu(In,Ga)Se$_2$ layer, which is formed on the metal film by multi-source vapor deposition or the like, a CdS layer (window layer) formed on the compound semiconductor layer by a solution method, and a n-type transparent conductive film (upper electrode) such as a ZnO:Al film (see, for instance, JP10(1998)-74967A). To produce a solar cell with a high energy conversion efficiency, in the conventional configuration, the p-type Cu(In,Ga)Se$_2$ layer functioning as the light-absorption layer was formed by applying a method in which a p-type Cu(In,Ga)Se$_2$ crystal was grown slowly over a long time. This is because the slow crystal growth allows not only for the reduction of crystal defects in the p-type Cu(In,Ga)Se$_2$ layer, but also the enhancement of the flatness of the surface thereof even though the layer is polycrystalline. Further, by forming a CdS layer on the p-type Cu(In,Ga)Se$_2$ layer with the flat surface, the CdS layer can be formed with excellent coverage.

Further, another example of the conventional substrate-type solar cell has been proposed that includes a glass substrate, a metal film (lower electrode) such as a MO film formed on the glass substrate by sputtering or the like, a chalcopyrite-structured compound semiconductor layer (light-absorption layer) having a p-type conductivity such as a p-type Cu(In,Ga)Se$_2$ layer, which is formed on the metal film by a selenidation method, a buffer layer such as ZnO film formed on the compound semiconductor, a window layer such as a ZnO:Al film, and an upper electrode (see, for example, JP10(1998)-135498A). In the selenidation method, the p-type Cu(In,Ga)Se$_2$ layer may be formed by forming a CuGa/In/Se precursor (a stacked film composed of a CuGa film, an In film, and a Se film) and thereafter causing solid phase diffusion of the CuGa/In/Se precursor by heating, or alternatively, the p-type Cu(In,Ga)Se$_2$ layer may be formed by forming a CuGa/In precursor and thereafter subjecting the same to heat treatment in H$_2$Se gas.

Further, still another example of the conventional substrate-type solar cell has been known that includes, as a buffer layer, a Zn(O,H) film, a Zn(O,S,OH) film, or the like formed by the solution method (see, for instance, Tokio Nakada et al., "Thin Solid Film" 431-432 (2003) 242-248).

DISCLOSURE OF INVENTION

Problem to be Solved by the Invention

In the formation of a p-type Cu(In,Ga)Se$_2$ layer by multi-source vapor deposition, if the layer is grown slowly as conventionally, even the formation of the p-type Cu(In,Ga)Se$_2$ layer with only a thickness of 2 μm takes approximately one hour, which results in extremely low mass productivity. On the other hand, if the p-type Cu(In,Ga)Se$_2$ layer with a thickness of 2 μm is grown rapidly over about several minutes, a n value as a diode index exceeds 2, thereby causing the obtained solar cell to have an energy conversion efficiency below 10%. This is because in the case where the p-type Cu(In,Ga)Se$_2$ layer is formed rapidly, the crystallinity of the p-type Cu(In,Ga)Se$_2$ layer deteriorates. Further, this also is because the p-type Cu(In,Ga)Se$_2$ layer has an uneven surface without flatness on its face. Still further, this is because if the n-type CdS layer is formed on the p-type Cu(In,Ga)Se$_2$ layer having the uneven surface on its face, the n-type CdS layer provides only insufficient coverage, which leads to a decrease in a shunt resistance in an equivalent circuit. This decrease of the shunt resistance stems from a phenomenon in which since a high-concentration n-type ITO film is formed on the n-type CdS layer providing insufficient coverage, a part of the n-type ITO film is in direct contact with the p-type Cu(In,Ga)Se$_2$ layer, not via the n-type CdS layer. This phenomenon causing the decrease of the shunt resistance occurs not only in the case of the p-type Cu(In,Ga)Se$_2$ layer, but also in the cases of the other light-absorption layers formed rapidly by multisource vapor deposition.

Further, also in the formation of a light-absorption layer such as the p-type Cu(In,Ga)Se$_2$ layer by the selenidation method, if the CuGa/In/se precursor layer or the CuGa/In precursor layer is grown rapidly over about several minutes, the layer has an uneven surface on its face, which causes the light-absorption layer such as the p-type Cu(In,Ga)Se$_2$ layer, which is formed finally, to have an uneven surface without flatness on its face. Therefore, also in the case where a n-type buffer layer or a n-type window layer is formed on the light-absorption layer formed by the selenidation method, the coverage of the n-type buffer layer or the n-type window layer becomes insufficient, which decreases a shunt resistance in an equivalent circuit. The decrease in the shunt resistance stems from a phenomenon in which, because a n-type transparent conductive film is formed on the n-type buffer layer or the n-type window layer providing the insufficient coverage, a part of the n-type transparent conductive film is in direct contact, not via the light-absorption layer without both of the n-type buffer layer or the n-type window layer.

To cope with this problem, in a solar cell that has a compound semiconductor layer (light-absorption layer) that is formed rapidly thereby having an uneven surface and a n-type window layer that is formed on the compound semiconductor layer thereby having insufficient coverage, the present invention improves solar cell properties such as an energy conversion efficiency by increasing a shunt resistance in an equivalent circuit of the solar cell, in other words, by decreasing a leak current of the solar cell.

Means for Solving Problem

In order to solve the above-described problems, a solar cell of the present invention includes: a substrate; a conductive film formed on the substrate; a compound semiconductor layer formed on the conductive film, including a p-type semiconductor crystal containing an element of Group Ib, an element of Group IIIb, and an element of Group VIb; a n-type window layer formed on the compound semiconductor layer, having an aperture; and a n-type transparent conductive film formed on the n-type window layer and on a portion of the compound semiconductor layer at the aperture of the n-type window layer. The solar cell is characterized in that the compound semiconductor layer includes a high-resistance part in a portion of the compound semiconductor layer in the vicinity of a surface thereof on a side opposite to the conductive film, the high-resistance part containing a n-type impurity doped in the p-type semiconductor crystal, and that the high-resistance part is located under the aperture of the n-type window layer. Herein the Groups of elements are referred to according to the short-form periodic table recommended by the International Union of Pure and Applied Chemistry (IUPAC). It should be noted that "Group Ib", "Group IIIb", and "Group VIb" refer to "Group 11", "Group 13", and "Group 16" according to the long-form periodic table recommended by IUPAC. The n-type impurity refers to an element that functions as a donor when being doped in the p-type semiconductor crystal.

In order to solve the above-described problems, a solar cell producing method of the present invention includes the steps of forming a conductive film on a substrate; growing a p-type semiconductor crystal on the conductive film, the p-type semiconductor crystal containing an element of Group Ib, an element of Group IIIb, and an element of Group VIb; forming a n-type window layer on the p-type semiconductor crystal, the n-type window layer having an aperture; and forming a n-type transparent conductive film on the n-type window layer and on a portion of the p-type semiconductor crystal at the aperture of the n-type window layer, and the solar cell producing method is characterized by further including the step of doping an n-type impurity in the p-type semiconductor crystal, in the vicinity of a surface of the p-type semiconductor crystal under the aperture of the n-type window layer, the doping step being carried out between the step of forming the n-type window layer and the step of forming the n-type transparent conductive film.

DESCRIPTION OF THE INVENTION

As described above, the solar cell of the present invention includes a substrate, a conductive film, a compound semiconductor layer having a high resistance part, a n-type window layer, and a n-type transparent conductive film. It should be noted that a surface of the compound semiconductor layer on the n-type window layer side is an uneven surface. The n-type window layer has an aperture (hereinafter also referred to as a "pinhole"), and the high-resistance part is located in a part of a p-type semiconductor crystal in the vicinity of a surface thereof below the aperture of the n-type window layer.

In the compound semiconductor layer, the high-resistance part is a part formed by doping with a n-type impurity in a part of the p-type semiconductor crystal in the vicinity of the surface thereof. Here, "the vicinity of the surface" refers to a region with a depth of not more than 500 nm from a surface of the compound semiconductor layer. The resistance of the high-resistance part is higher than a resistance of a part other than the high-resistance part in the p-type semiconductor crystal, the part being not doped with the n-type impurity (hereinafter this part also is referred to as "low-resistance part"). This is because the n-type impurity doped in the p-type semiconductor crystal functions as a donor, which results in an increase in the donor concentration in the high-resistance part as compared with the low-resistance part and a decrease in a carrier concentration that is determined by an acceptor concentration and a donor concentration in the p-type semiconductor crystal.

Figure 1:
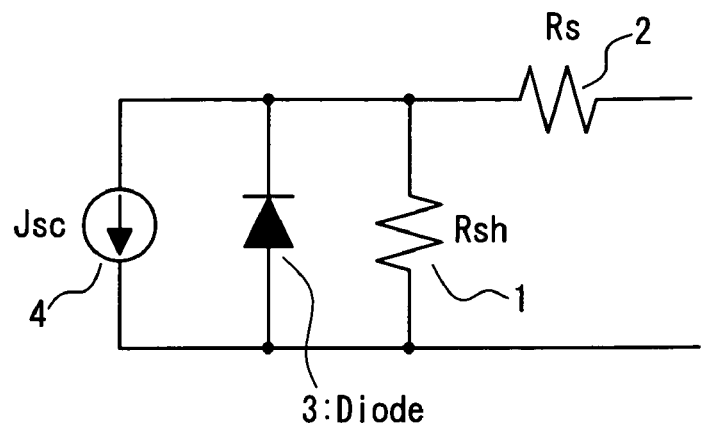
FIG. 1 is a circuit diagram showing an equivalent circuit of a solar cell according to Embodiment 1.

Here, the equivalent circuit of the solar cell is described with reference to FIG. 1. FIG. 1 is a circuit diagram showing an equivalent circuit of the solar cell of the present invention. It should be noted that an equivalent circuit of a conventional solar cell also is shown with the same configuration as that of the circuit diagram shown in FIG. 1. The equivalent circuit of the solar cell of the present invention includes, as shown in FIG. 1, a constant-current source 4 (short circuit current $J_{sc}$), a diode 3 formed with a p-n junction connected in parallel with the constant-current source 4, a shunt resistor 1 (resistance $R_{sh}$) connected in parallel with the diode 3, and a series resistor 2 (resistance $R_s$) connected in series with the diode 3. To obtain a solar cell with excellent properties, it is preferable that the resistance $R_{sh}$ of the shunt resistor 1 is large, while the resistance $R_s$ of the series resistor 2 is small. A decrease in the resistance $R_{sh}$ of the shunt resistor 1 is caused by leak current at the pn junction, leak current due to a crystal defect or deposition of an impurity in the vicinity of the pn junction, or the like in the solar cell. An increase in the resistance $R_s$ of the series resistor 2 is caused by increases in resistances, increases in Ohmic contact resistances, increases in wire resistances, etc. in the respective layers composing the solar cell. It should be noted that generally the shunt resistor 1 desirably has a resistance of not less than 2 k$\Omega \cdot$cm$^2$.

With the solar cell of the present invention, an area in which the low-resistance part and the n-type transparent conductive film are in direct contact with each other can be reduced even if the coverage of the n-type window layer is insufficient, and therefore, it is possible to make the shunt resistor 1 have a high resistance. Accordingly, the properties of the solar cell such as the energy conversion efficiency can be improved. Further, by controlling the size of the high-resistance part and the concentration of the n-type impurity in the high-resistance part, it is possible to make the shunt resistor 1 have a resistance of not less than 2 k$\Omega \cdot$cm$^2$.

In the solar cell of the present invention, it is preferable that the resistance of the high-resistance part is higher than a resistance of the n-type window layer. In this case, a resistance in a portion in which the n-type transparent conductive film and the low-resistance part are in contact with each other with the high-resistance part being interposed therebetween can be set higher than a resistance in a portion in which the foregoing two are in contact with each other with the n-type window layer being interposed therebetween, and therefore, the leak current at the portion where the n-type transparent conductive film and the compound semiconductor layer are in direct contact with each other can be decreased further. In other words, the shunt resistor 1 can be made to have a higher resistance.

In the solar cell of the present invention, a configuration can be achieved in which the compound semiconductor layer has a recessed surface on its face on the side opposite to the conductive film, and the high-resistance part is formed in the vicinity of the recessed surface. Usually, an aperture in the n-type window layer of insufficient coverage is formed on a recessed portion of the compound semiconductor layer having an uneven surface. Therefore, the shunt resistor 1 can be made to have a high resistance more efficiently by forming the high-resistance part in the vicinity of the recessed portion. The high-resistance part may be formed in a portion of the vicinity of the recessed surface, or alternatively may be formed in a larger region incorporating the vicinity of the recessed surface. It should be noted that in the case where the uneven surface has many recesses and projections, this becomes a factor for forming many pinholes, as well as provides an effect of enhancing the energy conversion efficiency since this configuration causes sunlight incident thereon to be diffused.

In the solar cell of the present invention, the n-type transparent conductive film preferably is connected with a part of the compound semiconductor layer (low-resistance part) other than the high-resistance part only via at least either one of the n-type window layer and the high-resistance part. This configuration causes the low-resistance part not to be in direct contact with the n-type transparent conductive film, thereby allowing the shunt resistor 1 to have a high resistance in an extremely excellent state.

The solar cell of the present invention further may be configured so that the high-resistance part contains, as the n-type impurity, at least one element selected from the group consisting of the elements of Group IIa and the elements of Group IIb. Here, "Group IIa" and "Group IIb" refer to "Group 2" and "Group 12" according to the long-form periodic table recommended by IUPAC. Examples of the configuration of the high-resistance part includes, specifically: a configuration in which one element of Group IIa is contained therein; a configuration in which a plurality of elements of Group IIa are contained; a configuration in which one element of Group IIb is contained; a configuration in which a plurality of elements of Group IIb is contained; and a configuration in which at least one element of Group IIa and at least one element of Group IIb are contained. With such a configuration, the element(s) of Group IIa and/or Group IIb function as a donor doped in the p-type semiconductor crystal. Further, since the element(s) of Group IIa and/or Group IIb easily is captured in holes of the p-type semiconductor crystal that function as acceptors, the foregoing element(s) allows the acceptor concentration to decrease and cause the donor concentration to increase. Therefore, the foregoing configuration allows the donor concentration with respect to the acceptor concentration in the high-resistance part to increase efficiently. It should be noted that the high-resistance part is never caused to exhibit a low-resistance n-type conductivity by an increase in a doped amount of the element(s) of Group IIa and/or Group IIb that tends to cause an extremely high-resistance n-type conductivity to be exhibited. In the solar cell of the present invention, to cause the element(s) to be captured in holes of the element of Group Ib or the like so as to function as a donor excellently, the n-type impurity in the high-resistance part preferably is Zn, Mg, or Ca.

As the p-type semiconductor crystal in the compound semiconductor layer, a chalcopyrite-structured compound semiconductor crystal containing Cu as the element of Group Ib, at least one element selected from the group consisting of Ga and In as the element of Group IIIb, and at least one element selected from the group consisting of S and Se as the element of Group VIb is preferred. With this configuration, a solar cell is achieved that exhibits a high energy-conversion efficiency and that substantially does not deteriorate over time due to irradiation with light. More specifically, in the solar cell of the present invention, for instance, the p-type semiconductor crystal of the compound semiconductor layer preferably is a chalcopyrite-structured $CuInSe_2$ crystal, a chalcopyrite-structured $Cu(Ga,In)Se_2$ crystal, or a chalcopyrite-structured $CuIn(S,Se)_2$ crystal. It should be noted that in the low-resistance part and the high-resistance part, other elements may be contained as required, as long as they do not harm the effects of the present invention.

In the solar cell of the present invention, the n-type window layer preferably is a ZnO film or a ZnMgO film. It should be noted that the n-type window layer in the solar cell of the present invention may have the same configuration as that of a n-type window layer of any known solar cell.

The solar cell of the present invention may be configured so as to include further a n-type buffer layer formed between the compound semiconductor layer and the n-type window layer, the n-type buffer layer having an aperture that is connected with the aperture of the n-type window layer. With this configuration, even in the case where the compound semiconductor layer and the n-type transparent conductive film are brought into contact with each other via the connected aperture going through the n-type window layer and the n-type buffer layer, the area in which the low-resistance part and the n-type transparent conductive film are in direct contact with each other can be reduced. Accordingly, the shunt resistor 1 is allowed to have a high resistance. In the solar cell of the present invention, the buffer layer preferably is a Zn(O,OH) film or a Zn(O,S,OH) film. It should be noted that the n-type buffer layer in the solar cell of the present invention may have the same configuration as that of a n-type buffer layer of any known solar cell.

In the solar cell of the present invention, the n-type transparent conductive film preferably is an ITO film, a $SnO_2$ film, an $In_2O_3$ film, a ZnO:Al film, or a ZnO:B film. It should be noted that the n-type transparent conductive film in the solar cell of the present invention may have the same configuration as that of a n-type transparent conductive film of any known solar cell.

The substrate preferably is a substrate that contains an element of Group Ia (alkali metal element). It should be noted that the "Group Ia" refers to "Group 1" according to the long-form periodic table recommended by IUPAC. In the case where an element of Group Ia is contained in the substrate, in the formation of the p-type semiconductor crystal of the compound semiconductor layer, the element of Group Ia of the substrate is diffused in the p-type semiconductor crystal via a conductive film, whereby the crystallinity of the p-type semiconductor crystal is enhanced. Further, it is preferable that a difference between a coefficient of linear expansion of the substrate and a coefficient of linear expansion of the p-type semiconductor crystal is small. This is because in the case where the difference is small, crystal defects of the p-type semiconductor crystal are reduced. Accordingly, in the solar cell of the present invention, it is preferable that the substrate is a glass substrate containing at least one alkali metal element selected from the group consisting of Na (sodium), K (potassium), and Li (lithium), and a difference between a coefficient of linear expansion of the substrate and a coefficient of linear expansion of the p-type semiconductor crystal is within a range of not less than $1\times10^{-6}$/K (Kelvin) and not more than $3\times10^{-6}$/K.

The conductive film preferably is a metal film such as a Mo (molybdenum) film, a Cr (chromium) film, a Au (gold) film, or a Pt (platinum) film. It should be noted that the conductive film in the solar cell of the present invention may have the same configuration as that of a conductive film in any known solar cell.

The following describes the solar cell producing method of the present invention. The solar cell producing method of the present invention includes, as described above, the steps of: forming a conductive film; growing a p-type semiconductor crystal; forming a n-type window layer having an aperture; doping a n-type impurity in the p-type semiconductor crystal, in the vicinity of a surface of the p-type semiconductor crystal under the aperture of the n-type window layer; and forming a n-type transparent conductive film. By carrying out the step of doping the n-type impurity in the p-type semiconductor crystal after the n-type window layer having an aperture is formed, the high-resistance part can be formed selectively in the vicinity of the surface of the p-type semiconductor crystal under the aperture of the n-type window layer. It should be noted that the part of the p-type semiconductor crystal in which the n-type impurity is not doped becomes the low-resistance part.

In the growth of the p-type semiconductor crystal, in the case where the p-type semiconductor crystal is a chalcopyrite-structured $Cu(Ga,In)Se_2$ crystal, the crystal preferably is grown at a film formation rate in a range of not less than 0.2 μm/min. and not more than 2 μm/min. This is because if the film formation rate is less than 0.2 μm/min., the p-type semiconductor crystal has smaller recesses and projections on its face, resulting in excellent coverage of the n-type window layer, whereas the time for growing the p-type semiconductor crystal increases, resulting in deterioration of manufacturability. However, even in the case where the film formation rate is less than 0.2 μm/min., the yield can be improved since the coverage defects accidentally occurring in the n-type window layer can be compensated. On the other hand, it is because if the film formation rate exceeds 2 μm/min., the crystallinity of the p-type semiconductor crystal deteriorates, which makes it difficult to use the p-type semiconductor crystal as a light-absorption layer of a solar cell. The foregoing crystal more preferably is grown at a film formation rate in a range of not less than 0.5 μm/min. and not more than 1.5 μm/min. In the case where the p-type semiconductor crystal is formed at the film formation rate in the foregoing range, the manufacturability can be improved significantly without a substantial decrease in the energy conversion efficiency, as compared with the case where the p-type semiconductor crystal is grown at a film formation rate of less than 0.2 μm/min. as conventionally.

In the solar cell producing method of the present invention, in the step of doping the n-type impurity in the p-type semiconductor crystal, the following method can be applied: an impurity film is formed by depositing the n-type impurity by a vapor deposition method or an evaporation method on the n-type window layer and the portion of the p-type semiconductor crystal that is exposed at the aperture of the n-type window layer, and the n-type impurity in the impurity film is diffused by a heat treatment into the portion of the p-type semiconductor crystal (this method hereinafter also is referred to as "first method"). With the first method, it is possible to form a high-resistance part in the inside of the p-type semiconductor crystal surely. Further, by controlling the film thickness of the impurity film, and the treating temperature and time in the heat treatment, a high-resistance part that has a desired size and contains the n-type impurity at a desired concentration can be formed easily.

In the first method, in the deposition of the n-type impurity, the n-type impurity may be deposited while varying a direction of deposition of the impurity with respect to the substrate. For instance, the substrate is rotated while being inclined at a desired angle with respect to the direction of deposition of the n-type impurity, or the substrate is moved so that a normal of a surface of the substrate defines a conical surface having the direction of deposition of the n-type impurity as its central axis, or further alternatively, the substrate is moved, along with a movement such as those described above, so that an angle formed between the normal direction of the surface of the substrate and the direction of deposition of the n-type impurity is varied. By applying this method, even if the exposed surface of the compound semiconductor layer that is exposed at the aperture of the n-type window layer is in a sinus-like complex recessed surface, the n-type impurity can be deposited in a large area of the exposed surface excellently.

In the solar cell producing method of the present invention, in the step of doping the n-type impurity in the p-type semiconductor crystal, the following method can be applied: an impurity film is formed by depositing the n-type impurity by plating on the portion of the p-type semiconductor crystal that is exposed at the aperture of the n-type window layer, and the n-type impurity in the impurity film is diffused by a heat treatment into the portion of the p-type semiconductor crystal (this method hereinafter also is referred to as "second method"). With the second method, it is possible to form a high-resistance part in the inside of the p-type semiconductor crystal surely. Further, since it is possible to form the impurity film selectively on the exposed portion of the p-type semiconductor crystal that is exposed at the aperture of the n-type window layer, it is possible to form the high-resistance part at an effective location efficiently. Still further, even if the exposed surface of the p-type semiconductor crystal that is exposed at the aperture of the n-type window layer is in a sinus-like complex recessed surface, the impurity can be deposited in the sinus-like complex recessed surface. Still further, by controlling the film thickness of the impurity film, and the treating temperature and time in the heat treatment, a high-resistance part that has a desired size and contains the n-type impurity at a desired concentration can be formed easily.

The first and second methods of the present invention preferably further include the step of removing the impurity film, between the step of doping the n-type impurity in the p-type semiconductor crystal and the step of forming the n-type transparent conductive film. If the impurity film remains, a resistance of a series resistor 2 ($R_s$) in an equivalent circuit of the solar cell shown in FIG. 1 increases, thereby deteriorating the properties of the solar cell such as an energy conversion efficiency, curve factors, etc.

In the solar cell producing method of the present invention, the following method can be applied: in the step of doping the n-type impurity in the p-type semiconductor crystal, the n-type impurity is implanted by ion implantation into the portion of the p-type semiconductor crystal via the aperture of the n-type window layer (this method hereinafter also is referred to as "third method"). With the third method, it is possible to form high-resistance part in the inside of the p-type semiconductor crystal surely. Further, by adjusting a dose amount, it is possible to form the high-resistance part containing the n-type impurity at a desired concentration easily.

In the third method, in the ion implantation, the n-type impurity may be implanted while varying a direction in which the n-type impurity ions are implanted with respect to the substrate. For instance, the substrate is rotated while being inclined at a desired angle with respect to the direction of the implantation of the n-type impurity ions, or the substrate is moved so that a normal of a surface of the substrate defines a conical surface having the direction of implantation of the n-type impurity ions as its central axis, or further alternatively, the substrate is moved, along with a movement such as those described above, so that an angle formed between the normal direction of the surface of the substrate and the direction of implantation of the n-type impurity ions is varied. By applying such a method, even if the exposed surface of the p-type semiconductor crystal that is exposed at the aperture of the n-type window layer is in a sinus-like complex recessed surface, the n-type impurity can be implanted in a large area of the exposed surface excellently.

In the third method, in the step of doping the n-type impurity in the p-type semiconductor crystal, it is preferable that a heat treatment is carried out additionally, after the n-type impurity is implanted. This is because by carrying out the heat treatment, damage occurring upon the implantation of the n-type impurity ions can be alleviated, and the n-type impurity ions thus implanted can be diffused in the p-type semiconductor crystal. Further, by controlling the treating temperature and time in the heat treatment, a high-resistance part that has a desired size and contains the n-type impurity at a desired concentration can be formed easily.

The first, second, and third method of the present invention further may include the step of forming a n-type buffer layer having an aperture, between the step of growing the p-type semiconductor crystal and the step of forming the n-type window layer. With such a method, the solar cell that includes the n-type buffer layer formed between the p-type semiconductor crystal and the n-type window layer can be produced.

To form the conductive film, the n-type window layer, the n-type buffer layer, and the n-type transparent conductive film, any known techniques may be used.

Embodiment 1

Figure 2:
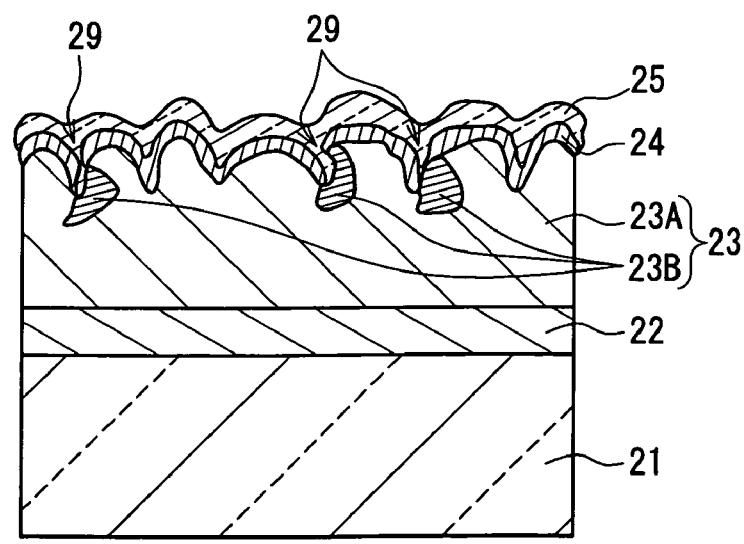
FIG. 2 is a schematic sectional view showing an example of a configuration of a solar cell according to Embodiment 1.
Figure 3A:
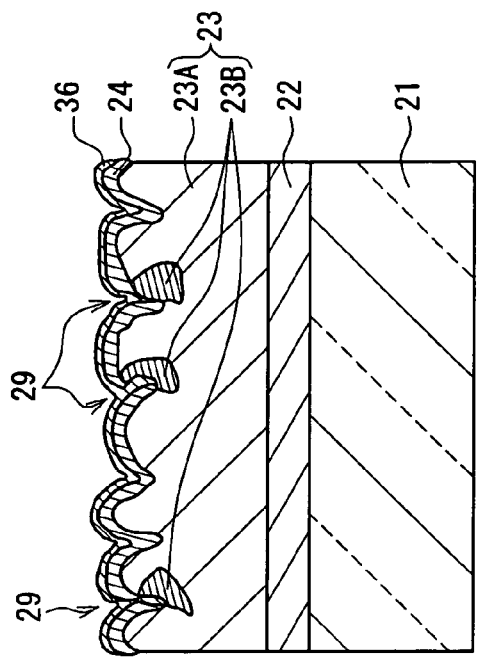
FIGS. 3A to 3D are schematic cross-sectional views showing steps of an example of a first method for producing the solar cell according to Embodiment 1.
Figure 3B:
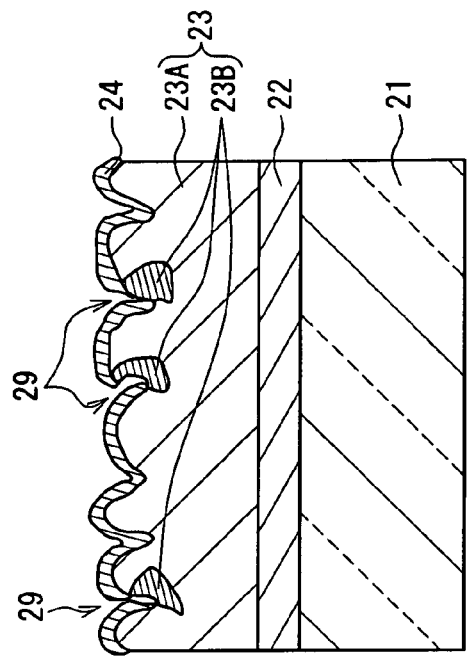
Figure 3C:
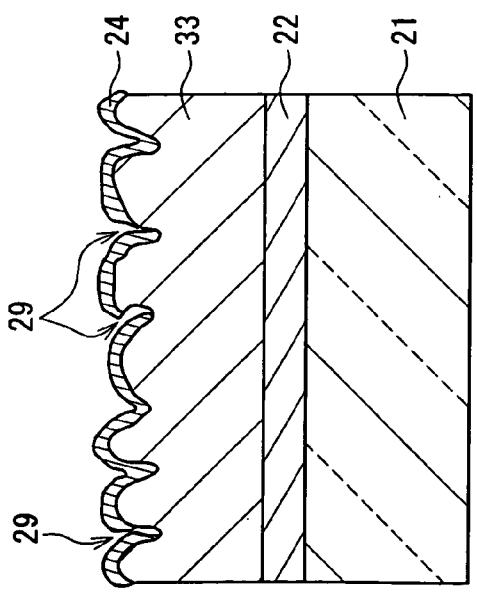
Figure 3D:
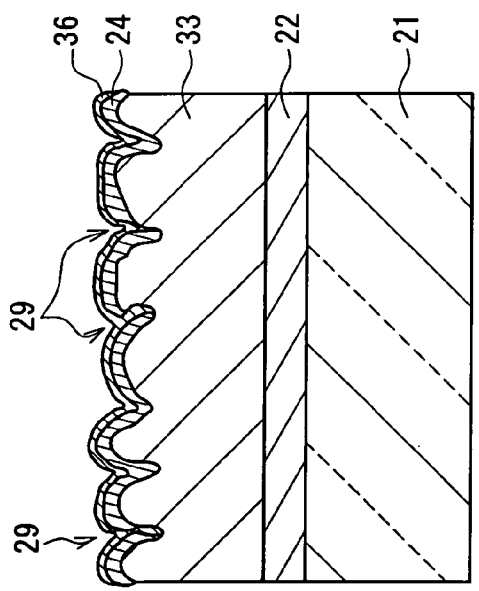

An embodiment of a solar cell of the present invention produced by the above-mentioned first method is described as Embodiment 1, with reference to FIGS. 2 and 3A to 3D. FIG. 2 is a schematic cross-sectional view illustrating a configuration of a solar cell according to Embodiment 1. FIGS. 3A to 3D are schematic cross-sectional views showing respective steps of the first method for producing the solar cell according to Embodiment 1. It should be noted that FIG. 3A shows a step of stacking a conductive film, a p-type semiconductor crystal, and a n-type window layer on a substrate, FIG. 3B shows a step of forming an impurity film by vapor deposition, FIG. 3C shows a step of diffusing a n-type impurity, and FIG. 3D shows a step of removing the impurity film.

The solar cell shown in FIG. 2 includes a substrate 21, a conductive film 22 formed on the substrate 21, a compound semiconductor layer 23 formed on the conductive film 22, a n-type window layer 24 with a n-type conductivity that has pinholes 29 (apertures) formed on the compound semiconductor layer, and a n-type transparent conductive film 25 formed on the n-type window layer 24 and exposed portions of the compound semiconductor layer 23 that are exposed in the pinholes 29 in the n-type window layer 24. The compound semiconductor layer 23 includes a low-resistance part 23A having the p-type conductivity formed on the conductive film 22, and high-resistance parts 23B that are formed on the low-resistance part 23A and under the pinholes 29 in the n-type window layer 24 and are doped with a n-type impurity. The n-type transparent conductive film 25 preferably is connected with the low-resistance part 23A only via either the high-resistance parts 23B or the n-type window layer 24.

In the solar cell shown in FIG. 2, the substrate 21 preferably is a substrate containing an element of Group Ia (alkali metal) such as Na. The conductive film 22 preferably is a metal film such as a Mo film. The p-type semiconductor crystal of the compound semiconductor layer 23 preferably is a chalcopyrite-structured Ib-IIIb-VIb crystal having the p-type conductivity, such as $CuInSe_2$ crystal, $Cu(Ga,In)Se_2$ crystal, $CuIn(S,Se)_2$ crystal, or the like. The impurity doped in the high-resistance parts 23B preferably is Zn. The n-type window layer 24 preferably is a n-type ZnMgO film. The n-type transparent conductive film 25 preferably is any one of an ITO film, a $SnO_2$ film, an $In_2O_3$ film, a ZnO:Al film, or a ZnO:B film. Further, a difference between a coefficient of linear expansion of the substrate 21 and a coefficient of linear expansion of the p-type semiconductor crystal preferably is within a range of not less than $1\times10^{-6}$/K and not more than $3\times10^{-6}$/K.

The solar cell according to Embodiment 1 having the structure shown in FIG. 2 is produced in the following manner. First, as shown in FIG. 3A, the conductive film 22 is formed on the substrate 21 by sputtering. It should be noted that the conductive film 22 preferably has a sheet resistance of not more than $0.5\Omega/\square$. For instance, by sputtering, a Mo film with a film thickness of approximately 0.4 μm is formed.

Next, as shown in FIG. 3A, the p-type semiconductor crystal 33 is formed on the conductive film 22 by multisource vapor deposition or selenidation. For instance, in the case where the p-type semiconductor crystal 33 is chalcopyrite-structured $Cu(Ga,In)Se_2$ crystal, the multisource vapor deposition employing Cu, Ga, In, and Se as deposition sources can be used. Here, the film preferably is grown at a film formation rate in a range of not less than 0.5 μm/min. and not more than 1.5 μm/min. On the other hand, in the case where selenidation is used, a CuGa/In/Se precursor is formed by sputtering, and subsequently the CuGa/In/Se precursor is heated to approximately 450° C. to 550° C., so that a $Cu(Ga,In)Se_2$ film is formed by solid phase diffusion. Alternatively, a CuGa/In precursor is formed by sputtering, and subsequently the CuGa/In precursor is subjected to a heat treatment in a $H_2Se$ gas, so that a $Cu(Ga,In)Se_2$ film is formed. The p-type semiconductor crystal 33 formed by multisource vapor deposition or selenidation consequently has an uneven surface on its upper face.

Next, as shown in FIG. 3A, the n-type window layer 24 is formed on the uneven surface of the p-type semiconductor crystal 33 by sputtering or a solution method. For instance, a ZnMgO film with a film thickness of approximately 100 nm is formed as the n-type window layer 24 by a sputtering method employing ZnO and MgO as targets. Since the p-type semiconductor crystal 33 has an uneven surface on its upper face, pinholes 29 (apertures) are formed in the n-type window layer 24.

Next, as shown in FIG. 3B, Zn as a n-type impurity is deposited from above the n-type window layer 24 by vapor deposition or CVD (chemical vapor deposition), so that an impurity film 36 is formed on the n-type window layer 24 and inside the pinholes 29 in the n-type window layer 24. For instance, a Zn film with a film thickness of approximately 20 nm is formed as the impurity film 36.

Next, the obtained stack composed of the substrate 21, the conductive film 22, the p-type semiconductor crystal 33, the n-type window layer 24, and the impurity film 36 is annealed (heat treatment). For instance, it is heated at 170° C. in a nitrogen atmosphere for 20 minutes. By so doing, the n-type impurity is diffused to the inside of the p-type semiconductor crystal 33 from portions of the impurity film 36 in direct contact with the p-type semiconductor crystal 33 (the impurity film portions inside the pinholes 29), and as shown in FIG. 3C, the compound semiconductor layer 23 that includes the high-resistance parts 23B containing the n-type impurity diffused from the impurity film 36 and the low-resistance part 23A not containing the n-type impurity is formed.

Next, as shown in FIG. 3D, the impurity film 36 remaining on the compound semiconductor layer 23 and the n-type window layer 24 is removed by etching. For the removal of the impurity film 36, the dry etching technique may be used, but to simply and surely remove substantially only the impurity film 36, the wet etching preferably is used in which the stack is brought into contact with an etching solution such as hydrochloric acid. For instance, the stack is immersed in hydrochloric acid for several seconds. After the impurity film 36 (see FIG. 3C) is removed, the stack composed of the substrate 21, the conductive film 22, the compound semiconductor layer 23 including the low-resistance part 23A and the high-resistance parts 23B, and the n-type window layer 24 is washed with a washing liquid such as pure water.

Next, as shown in FIG. 2, the n-type transparent conductive film 25 is formed by sputtering on the exposed surfaces of the compound semiconductor layer 23 exposed in the pinholes 29 of the n-type window layer 24, as well as on the n-type window layer 24. Through the foregoing steps, the solar cell according to Embodiment 1 having the configuration shown in FIG. 2 is produced.

The solar cell according to Embodiment 1 produced through the steps shown in FIGS. 3A to 3D is characterized in that the resistance of the shunt resistor 1 (see FIG. 1) of the equivalent circuit of the solar cell can be increased surely, as compared with a solar cell of a comparative example produced without going through the steps shown in FIGS. 3B to 3D that accordingly does not contain the n-type impurity in the high-resistance parts 23B. Further, the resistance of the shunt resistor 1 of the equivalent circuit of the solar cell according to Embodiment 1 can be set to not less than 5 times the resistance of the counterpart of the solar cell of a comparative example corresponding to Embodiment 1, or can be set to not less than 2 k$\Omega \cdot$cm$^2$, which is a preferable value for a solar cell. Still further, the solar cell according to Embodiment 1 can be configured so as to have an energy conversion efficiency of not less than 17%, and to have a n value as the diode index of not more than 1.5.

The above description refers to a configuration that does not include a buffer layer, but a buffer layer may be formed between the compound semiconductor layer and the n-type window layer as required.

Embodiment 2

Figure 4A:
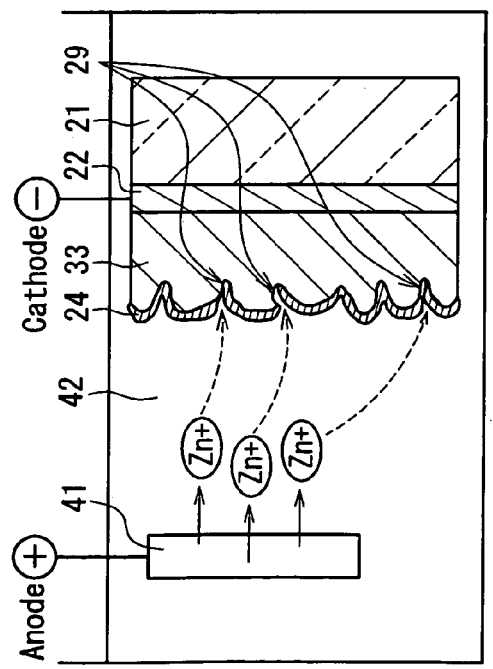
FIGS. 4A to 4D are schematic cross-sectional views showing steps of an example of a second method for producing a solar cell according to Embodiment 2.
Figure 4B:
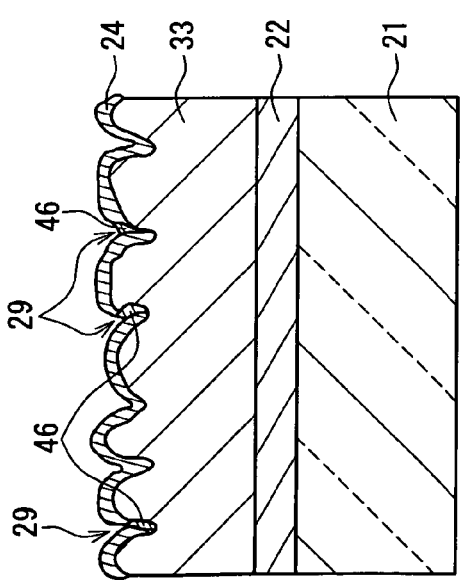
Figure 4C:
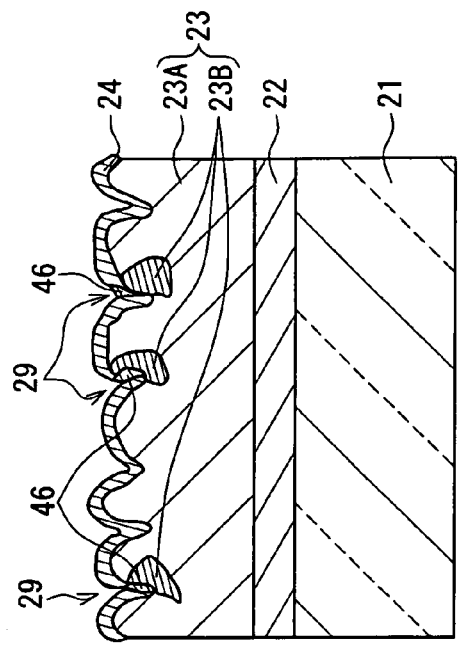
Figure 4D:
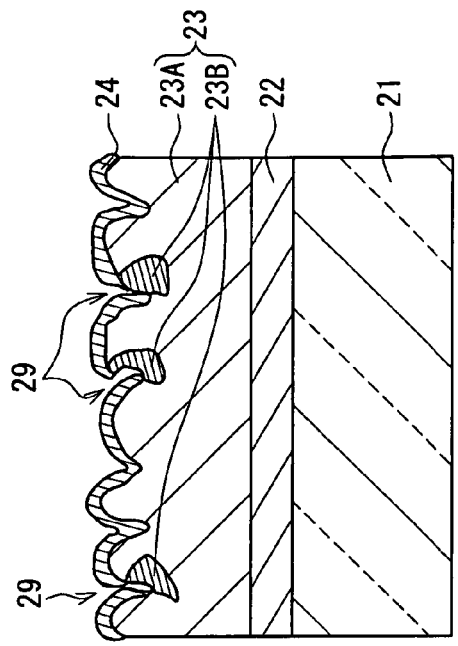

An embodiment of a solar cell produced by the above-mentioned second method is described as Embodiment 2, with reference to FIGS. 4A to 4D. FIGS. 4A to 4D are schematic cross-sectional views showing respective steps of the second method for producing the solar cell according to Embodiment 2. It should be noted that FIG. 4A shows a step of forming an impurity film by plating, FIG. 4B shows a state after the completion of the step of forming the impurity film, FIG. 4C shows a step of diffusing a n-type impurity, and FIG. 4D shows a step of removing the impurity film.

The solar cell according to Embodiment 2 is produced by the same method as the method for producing the solar cell according to Embodiment 1 except for the manner of how the high-resistance parts are formed. Further, the structure of the solar cell according to Embodiment 2 is substantially the same as the solar cell according to Embodiment 1 shown in FIG. 2. Therefore, only the second method for producing the solar cell according to Embodiment 2 is described here. It should be noted that FIG. 2 is referred to as required.

The solar cell according to Embodiment 2 is produced in the following manner. First, as shown in FIG. 4A, the conductive film 22, the p-type semiconductor crystal 33, and the n-type window layer 24 having the pinholes 29 are stacked on the substrate 21 in the stated order by the same method as that for Embodiment 1 described above, whereby a stack is formed.

Next, as shown in FIG. 4A, after the stack is immersed in an electroplating solution 42 contained in a solution vessel, a voltage is applied by using an electrode 41 formed with Zn metal and provided in the electroplating solution 42 as an anode and the conductive film 22 in the stack as a cathode. The application of a voltage causes an ionized n-type impurity (n-type impurity ions) to be dissolved into the electroplating solution 42 from the electrode 41, and the dissolved n-type impurity ions are deposited selectively on the exposed surfaces of the p-type semiconductor crystal 33 exposed in the pinholes 29 of the n-type window layer 24.

Here, the selective deposition of the n-type impurity ions is described. If the n-type window layer 24 has a high resistance, the n-type window layer 24 and the compound semiconductor layer 23 forms a pn junction to which a voltage is applied in a reverse bias state, which causes substantially no electric current to run via the n-type window layer 24 having the n-type conductivity. Consequently, none of, or at most, a trace of the n-type impurity ions are deposited on the n-type window layer 24. On the other hand, since electric current runs via the exposed surfaces of the p-type semiconductor crystal 33 exposed in the pinholes 29 of the n-type window layer 24, the n-type impurity ions are deposited on the foregoing surfaces. Thus, it is possible to cause the n-type impurity ions to be deposited selectively on the exposed surfaces of the p-type semiconductor crystal 33 exposed in the pinholes 29 of the n-type window layer 24. With this, as shown in FIG. 4B, impurity films 46 are formed selectively on the exposed portions of the p-type semiconductor crystal 33 exposed in the pinholes 29 of the n-type window layer 24. For instance, Zn films with a film thickness of approximately 20 nm are formed as the impurity films 46.

Next, the stack in which the impurity film 46 is formed is annealed (heat treatment) so that the n-type impurity composing the impurity film 46 is diffused to the inside of the p-type semiconductor crystal 33. For instance, it is heated at 170° C. in a nitrogen atmosphere for 20 minutes. By so doing, the n-type impurity is diffused to the inside of the p-type semiconductor crystal 33 from the impurity films 46 in direct contact with the p-type semiconductor crystal 33 (the impurity films inside the pinholes 29), and as shown in FIG. 4C, the compound semiconductor layer 23 that includes the high-resistance parts 23B containing the n-type impurity diffused from the impurity films 46 and the low-resistance part 23A not containing the n-type impurity diffused from the impurity films 46 is formed.

Next, as shown in FIG. 4D, it is preferable that the impurity films 46 remaining on the compound semiconductor layer 23 are removed by the same method as that in Embodiment 1 described above. After the removal of the impurity films 46 (see FIG. 4C), the stack composed of the substrate 21, the conductive film 22, the compound semiconductor layer 23 including the low-resistance part 23A and the high-resistance parts 23B, and the n-type window layer 24 is washed.

Next, as shown in FIG. 2, the n-type transparent conductive film 25 is formed by sputtering or CVD on the exposed surfaces of the compound semiconductor layer 23 exposed in the pinholes 29 of the n-type window layer 24, as well as on the n-type window layer 24. Through the foregoing steps, the solar cell according to Embodiment 2 is produced.

The solar cell according to Embodiment 2 produced through the steps shown in FIGS. 4A to 4D is characterized in that the resistance of the shunt resistor 1 (see FIG. 1) of the equivalent circuit of the solar cell can be increased surely, as compared with a solar cell of a comparative example produced without going through the steps shown in FIGS. 4B to 4D that accordingly does not contain the n-type impurity in high-resistance parts 23B. Further, the resistance of the shunt resistor 1 of the equivalent circuit of the solar cell according to Embodiment 2 can be set to not less than 5 times the resistance of the counterpart of the solar cell of a comparative example corresponding to Embodiment 2, or can be set to not less than 2 k$\Omega \cdot cm^2$, which is a preferable value for a solar cell. Still further, the solar cell according to Embodiment 2 can be configured so as to have an energy conversion efficiency of not less than 17%, and to have a n value as the diode index of not more than 1.5.

Embodiment 3

Figure 5C:
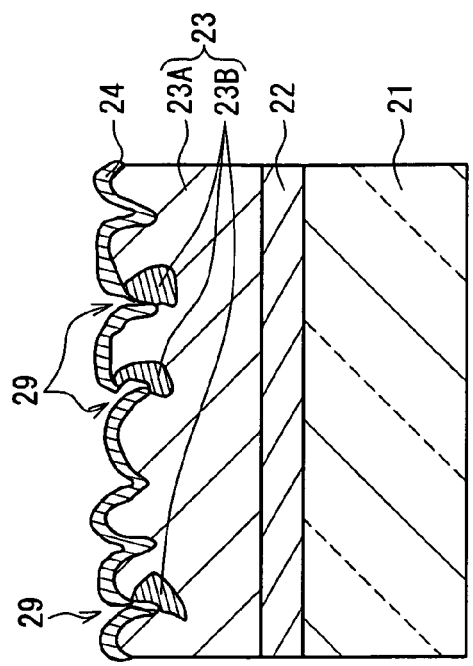
FIGS. 5A to 5C are schematic cross-sectional views showing steps of an example of a third method for producing a solar cell according to Embodiment 3.
Figure 5A:
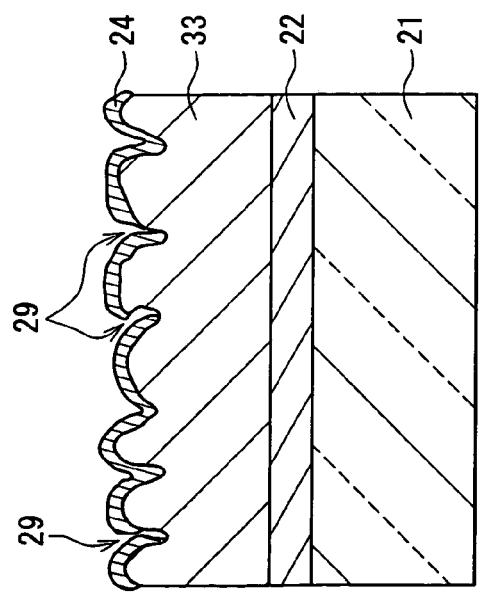
Figure 5B:
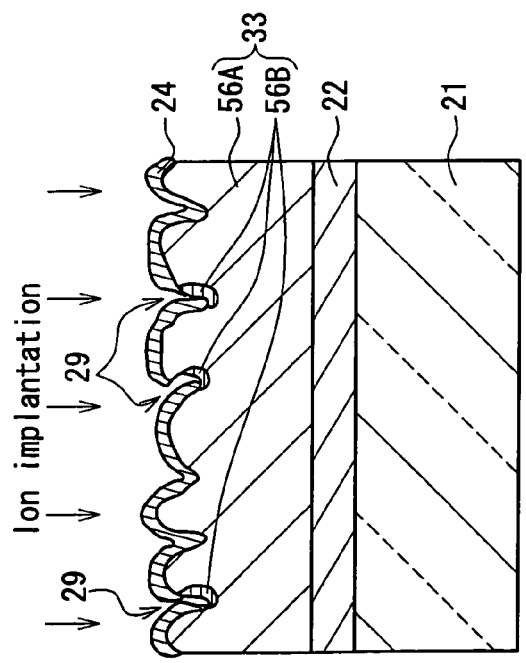

An embodiment of a solar cell of the present invention produced by the above-mentioned third method is described as Embodiment 3, with reference to FIGS. 5A to 5C. FIGS. 5A to 5C are schematic cross-sectional views showing respective steps of the third method for producing the solar cells of the present invention. It should be noted that FIG. 5A shows a step of stacking a conductive film, a p-type semiconductor crystal, and a n-type window layer on a substrate, FIG. 5B shows a step of implanting a n-type impurity by ion implantation, and FIG. 5C shows a step of forming high-resistance parts by diffusing the n-type impurity thus implanted.

The solar cell according to Embodiment 3 is produced by the same method as the methods for producing the solar cells according to Embodiments 1 and 2 except for the manner of how high-resistance parts are formed. Further, the configuration of the solar cell according to Embodiment 3 is substantially the same as the above-described solar cell according to Embodiment 1 shown in FIG. 2. Therefore, only the third method for producing the solar cell according to Embodiment 3 is described here. It should be noted that FIG. 2 is referred to as required.

The solar cell according to Embodiment 3 is produced in the following manner. First, as shown in FIG. 5A, the conductive film 22, the p-type semiconductor crystal 33, and the n-type window layer 24 having the pinholes 29 are stacked on the substrate 21 in the stated order by the same method as that for Embodiment 1 described above, whereby a stack is formed.

Next, as shown in FIG. 5B, an ionized n-type impurity (n-type impurity ions) is implanted in the p-type semiconductor crystal 33 of the stack, from the side of the stack where the p-type semiconductor crystal 33 is formed. By so doing, the n-type impurity ions are implanted in the p-type semiconductor crystal 33 via the pinholes 29 of the n-type window layer 24, whereby ion-implanted parts 56B are formed inside the p-type semiconductor crystal 33 under the pinholes 29 of the p-type window layer 24. As the n-type impurity, Zn, Mg, or Ca is preferred. It should be noted that the part of the p-type semiconductor crystal 33 in which the impurity ions are not implanted is a non-ion-implanted part 56A. For instance, in the case where the n-type impurity ions are Zn ions, the Zn ions accelerated with an energy of approximately 50 keV are implanted until the dose amount becomes not less than $5 \times 10^{15}/cm^2$ and not more than $5 \times 10^{16}/cm^2$, whereby the ion-implanted parts 56B are formed. In this case, the Zn ions intrude to a depth of approximately 0.01 μm to 0.05 μm. It should be noted that the acceleration energy and the dose amount are to be adjusted appropriately according to the type of an element used as an impurity ion, the type of the p-type semiconductor crystal 33 subjected to the ion implantation, etc.

Next, after the ion-implanted parts 56B are formed, the stack including the substrate 21, the conductive film 22, the p-type semiconductor crystal 33 having the non-ion-implanted part 56A and the ion-planted parts 56B, and the n-type window layer 24 is annealed (heat treatment), so that the n-type impurity in the ion-implanted parts 56B are diffused in the non-ion-implanted part 56A. By so doing, the compound semiconductor layer 23 that includes the high-resistance parts 23B containing the n-type impurity and the low-resistance part 23A not containing the n-type impurity diffused from the ion-implanted parts 56B is formed, as shown in FIG. 5C. Besides, this annealing allows the compound semiconductor layer 23 (p-type semiconductor crystal 33) to be restored from damage that occurs upon the ion implantation.

Next, as shown in FIG. 2, the n-type transparent conductive film 25 having the n-type conductivity is formed by sputtering on the exposed surfaces of the compound semiconductor layer 23 exposed in the pinholes 29 of the n-type window layer 24, as well as on the n-type window layer 24. Through the foregoing steps, the solar cell according to Embodiment 3 is produced.

The solar cell according to Embodiment 3 produced through the steps shown in FIGS. 5A to 5C is characterized in that the resistance of the shunt resistor 1 (see FIG. 1) of the equivalent circuit of the solar cell can be increased surely, as compared with a solar cell of a comparative example produced without going through the steps shown in FIGS. 5B and 5C that accordingly does not contain the n-type impurity in the high-resistance parts 23B. Further, the resistance of the shunt resistor of the equivalent circuit of the solar cell according to Embodiment 3 can be set to not less than 5 times the resistance of the counterpart of a solar cell of a comparative example corresponding to Embodiment 3, or can be set to not less than 2 k$\Omega \cdot cm^2$, which is a preferable value for a solar cell. Still further, the solar cell according to Embodiment 3 can be configured so as to have an energy conversion efficiency of not less than 17%, and a n value as the diode index of not more than 1.5.

Embodiment 4

Figure 6:
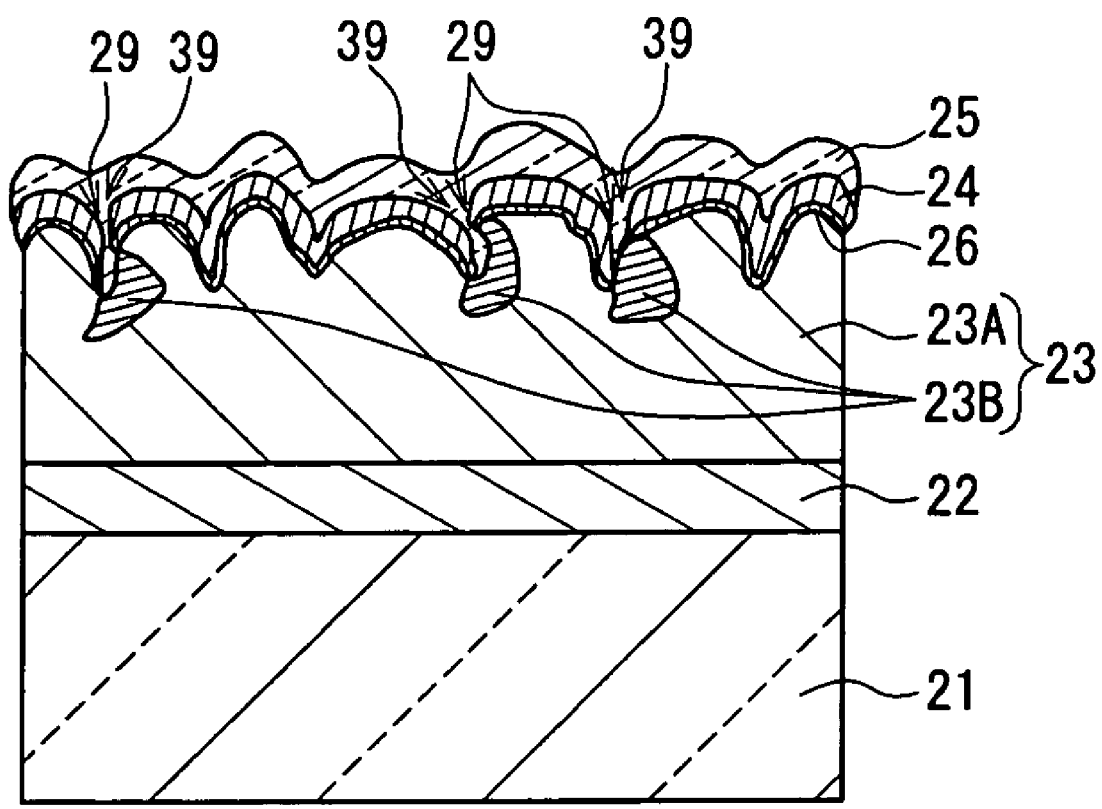
FIG. 6 is a schematic cross-sectional view showing an example of a configuration of a solar cell according to Embodiment 4.

An embodiment of a solar cell having a n-type buffer layer is described as Embodiment 4, with reference to FIG. 6. It should be noted that the solar cell according to Embodiment 4 has the same configuration as that of the solar cells according to Embodiments 1 to 3 described above except that the n-type window layer is a ZnO film and the solar cell includes a n-type buffer layer. Therefore, the same members are designated with the same referential numerals and the detailed descriptions of the same are omitted.

The solar cell shown in FIG. 6 includes a substrate 21, a conductive film 22, a compound semiconductor layer 23, a n-type window layer 24 that has the n-type conductivity and includes pinholes 29 (apertures), a n-type transparent conductive film 25, and a n-type buffer layer 26 that is formed between the compound semiconductor layer 23 and the n-type window layer 24 and that includes pinholes 39 connected with the pinholes 29 of the n-type window layer 24. It is preferable that the n-type window layer 24 is a ZnO film, and the n-type buffer layer 26 is a Zn(O,OH) film or a Zn(O,S,OH) film.

The solar cell according to Embodiment 4 is produced in the following manner. In the method for producing the solar cell according to Embodiment 4, the n-type buffer layer 26 is formed by a solution method after the p-type semiconductor crystal is grown and before the n-type window layer 24 is formed in the above-described first to third producing methods. For instance, the n-type buffer layer 26 with a film thickness of approximately 100 nm is formed. In the case where the n-type buffer layer 26 is a Zn(O,OH) film, after the p-type semiconductor crystal is grown, a stack including the substrate 21, the conductive film 22, and the p-type semiconductor crystal is brought into contact with ammonia water whose pH is adjusted to approximately 7 to 12, whose liquid temperature is kept at 50° C. to 80° C., and in which a zinc salt is dissolved, whereby a Zn(O,OH) film can be formed. Further, in the case where the n-type buffer layer 26 is a Zn(O,S,OH) film, a stack including the substrate 21, the conductive film 22, and the p-type semiconductor crystal is brought into contact with ammonia water whose pH is adjusted to approximately 7 to 12, whose liquid temperature is kept at 50° C. to 80° C., and in which a zinc salt and a sulfur-containing salt are dissolved, whereby a Zn(O,S, OH) film can be formed. Since the p-type semiconductor crystal has an uneven surface on its top face, the pinholes 39 (apertures) are formed in the n-type buffer layer 26.

After the n-type buffer layer 26 is formed, a ZnO film as the n-type window layer 24 is formed on the uneven surface of the n-type buffer layer 26 by sputtering or a solution method. For instance, a ZnO film with a film thickness of approximately 100 nm is formed by a sputtering method employing ZnO as a target. Since the p-type semiconductor crystal and the n-type buffer layer 26 have uneven surfaces on their top faces, the pinholes 29 (apertures) are formed in the n-type window layer. The remaining steps are performed in the same manner as those of the first to third methods described above, whereby the solar cell according to Embodiment 4 is produced.

The solar cell according to Embodiment 4 is characterized in that the resistance of the shunt resistor 1 (see FIG. 1) of the equivalent circuit of the solar cell can be increased surely, as compared with a solar cell of a comparative example having the same configuration except that the solar cell does not contain the n-type impurity in the high-resistance parts 23B. Further, the resistance of the shunt resistor of the equivalent circuit of the solar cell according to Embodiment 4 can be set to not less than 5 times the resistance of the counterpart of the solar cell of a comparative example corresponding to Embodiment 4, or can be set to not less than 2 k$\Omega \cdot$cm$^2$, which is a preferable value for a solar cell. Still further, the solar cell according to Embodiment 4 can be configured so as to have an energy conversion efficiency of not less than 17%, and to have a n value as the diode index of not more than 1.5.

Example 1

An example of the above-described solar cell according to Embodiment 1 is described below as Example 1. Here, FIGS. 2 and 3A to 3D are referred to. The solar cell of Example 1 shown in FIG. 2 was configured so that the substrate 21 was a soda lime glass substrate, the conductive film 22 was a Mo film, the p-type semiconductor crystal of the compound semiconductor layer 23B was a chalcopyrite-structured p-type Cu(Ga,In)Se$_2$ crystal, the n-type impurity doped in the high-resistance parts 23B was Zn, the n-type window layer 24 was a n-type ZnMgO film, and the n-type transparent conductive film 25 was an ITO film. The resistance of the high-resistance parts 23 was set to be higher than the resistance of the n-type ZnMgO film. Further, the ITO film was formed so as to be connected with the low-resistance part 23A via substantially only at least one of the n-type ZnMgO film and the high-resistance parts 23B.

The solar cell of Example 1 was produced in the following manner. First, as shown in FIG. 3A, the Mo film with a film thickness of approximately 400 nm as the conductive film 22 was formed on the soda lime glass substrate as the substrate 21 by sputtering or the like. The Mo film had a sheet resistance of approximately 0.5$\Omega/\square$. Next, as shown in FIG. 3A, the chalcopyrite-structured p-type Cu(Ga,In)Se$_2$ crystal as the p-type semiconductor crystal 33 was grown on the Mo film by vapor deposition, at a film formation rate of approximately 1 μm/min. until the film had a thickness of approximately 2 μm in average. The p-type Cu(Ga,In)Se$_2$ crystal had an uneven surface. Next, as shown in FIG. 3A, the n-type ZnMgO film as the n-type window layer 24 was formed on the p-type Cu(Ga,In)Se$_2$ crystal so as to have a film thickness of approximately 100 nm by a sputtering method employing ZnO and MgO as targets. Since the p-type Cu(Ga,In)Se$_2$ crystal had an uneven surface, the pinholes 29 (apertures) were formed in the n-type ZnMgO film. The pinholes 29 were formed substantially in the vicinities of recessed portions of the uneven surface of the p-type Cu(Ga,In)Se$_2$ crystal.

Next, as shown in FIG. 3B, Zn was deposited by vapor deposition on the n-type ZnMgO film and the exposed portions of the p-type Cu(Ga,In)Se$_2$ crystal exposed in the pinholes 29 in the n-type ZnMgO film, so that a Zn film with a film thickness of approximately 20 nm was formed as the impurity film 36. Next, as shown in FIG. 3C, the stack composed of the soda lime glass substrate, the Mo film, the p-type Cu(Ga, In)Se$_2$ crystal, and the Zn film was annealed at 170K for 20 minutes. This caused Zn to be diffused in the inside of the p-type Cu(Ga,In)Se$_2$) crystal from portions of the Zn film in direct contact with the p-type Cu(Ga,In)Se$_2$ crystal (portions of the Zn film in the pinholes 29), whereby the compound semiconductor layer 23 including the high-resistance parts 23B containing Zn and the low-resistance part 23A not containing Zn diffused from the Zn film was formed. Next, the stack in which the high-resistance parts 23B were formed was immersed in a hydrochloric acid solution prepared as an etching solution for three minutes, so that the Zn film remaining on the p-type Cu(Ga,In)Se$_2$ crystal and the n-type ZnMgO film was removed. Then, the stack from which the Zn film was removed was raised from the hydrochloric acid solution, and subsequently, surfaces thereof were washed with pure water.

Next, as shown in FIG. 2, an ITO film as the n-type transparent conductive film 25 was formed by sputtering on the n-type ZnMgO film and the high-resistance parts 23B. With this, the production of the solar cell of Example 1 was completed.

The solar cell of Example 1 had a shunt resistance of approximately 3 k$\Omega \cdot$cm$^2$, which was approximately 6 times the resistance of a solar cell according to Comparative Example 1 produced by the same method as that for the solar cell of Example 1 except that the step of forming the high-resistance parts 23B (impurity film) was not carried out, Comparative Example 1 accordingly being characterized in that Zn was not contained in the high-resistance parts 23B. Further, the solar cell of Example 1 had an energy conversion efficiency of 17.6%. Still further, though the p-type Cu(Ga, In)Se$_2$ crystal used in the solar cell of Example 1 was a polycrystal, the solar cell of Example 1 had a n value (diode index) of 1.47, which is equal to that in the case where the crystal used therein is a single crystal.

Example 2

An example of the above-described solar cell according to Embodiment 2 is described below as Example 2, with reference to FIGS. 2 and 4A to 4D. The solar cell of Example 2 shown in FIG. 2 was configured so that the substrate 21 was a soda lime glass substrate, the conductive film 22 was a Mo film, the p-type semiconductor crystal of the compound semiconductor layer 23 was a chalcopyrite-structured p-type Cu(Ga,In)Se$_2$ crystal, the n-type impurity doped in the high-resistance parts 23B was Zn, the n-type window layer 24 was a n-type ZnMgO film, and the n-type transparent conductive film 25 was an ITO film. The resistance of the high-resistance parts 23 was set to be higher than the resistance of the n-type ZnMgO film. Further, the ITO film was formed so as to be connected with the low-resistance part 23A via substantially only at least one of the n-type ZnMgO film and the high-resistance parts 23B.

The solar cell of Example 2 was produced in the following manner. First, as shown in FIG. 4A, the Mo film with a film thickness of approximately 400 nm was formed on the soda lime glass substrate by sputtering or the like. The Mo film had a sheet resistance of approximately 0.5Ω/□. Next, as shown in FIG. 4A, the chalcopyrite-structured p-type Cu(Ga,In)Se$_2$ crystal as the p-type semiconductor crystal 33 was grown on the Mo film by vapor deposition, at a film formation rate of 1 μm/min. until the film had a thickness of approximately 2 μm. The p-type Cu(Ga,In)Se$_2$ crystal had an uneven surface. Next, as shown in FIG. 4A, the n-type ZnMgO film as the n-type window layer 24 was formed on the p-type semiconductor crystal 33 so as to have a film thickness of approximately 100 nm by a sputtering method employing ZnO and MgO as targets. Since the p-type Cu(Ga,In)Se$_2$ crystal had an uneven surface, the pinholes 29 (apertures) were formed in the n-type ZnMgO film. The pinholes 29 were formed substantially in the vicinities of recessed portions of the uneven surface of the p-type Cu(Ga,In)Se$_2$ crystal.

Next, as shown in FIG. 4A, the stack composed of the soda lime glass substrate, the Mo film, the p-type Cu(Ga, In)Se$_2$ crystal, and the n-type ZnMgO film is immersed in an electroplating solution 42 containing zinc sulfate, which was contained in a solution vessel. After the stack was immersed, a voltage in a range of 0.5 V to 0.6 V was applied for three minutes by using a Zn electrode 41 formed with Zn (n-type impurity) and provided in the electroplating solution 42 as an anode and the Mo film in the stack as a cathode. The application of a voltage caused Zn$^+$ ions (n-type impurity ions) to be leached out of the Zn electrode 41 into the electroplating solution 42, and the leached Zn$^+$ ions were deposited selectively on the exposed surfaces of the p-type Cu(Ga,In)Se$_2$ crystal exposed in the pinholes 29 of the n-type ZnMgO film. By so doing, Zn films with a film thickness of approximately 20 nm were formed as the impurity films 46, as shown in FIG. 4B.

Next, the stack with the Zn films being formed therein was annealed at a substrate temperature of 170° C. for 20 minutes. This caused Zn in the Zn films to be diffused in the inside of the p-type Cu(Ga,In)Se$_2$) crystal, whereby the compound semiconductor layer 23 including the high-resistance parts 23B containing Zn and the low-resistance part 23A not containing Zn diffused from the Zn films was formed as shown in FIG. 4C. Next, by applying wet etching, the stack including the compound semiconductor layer 23 having the low-resistance part 23A and the high-resistance parts 23B was immersed in a hydrochloric acid solution, so that the Zn films remaining on the n-type ZnMgO film and the high-resistance parts 23B were removed. Then, the stack from which the Zn films were removed was washed with pure water.

Next, as shown in FIG. 2, an ITO film as the n-type transparent conductive film 25 was formed by sputtering on the high-resistance parts 23B and the n-type ZnMgO film. With this, the production of the solar cell of Example 2 was completed.

A shunt resistor 1 (see FIG. 1) of an equivalent circuit of the solar cell of Example 2 had a resistance of approximately 2 kΩ·cm$^2$, which was approximately 5 times the resistance of a solar cell according to Comparative Example 2 produced by the same method as that for the solar cell of Example 2 except that the step of forming the high-resistance parts 23B was not carried out, Comparative Example 2 accordingly being characterized in that Zn was not contained in the high-resistance parts 23B. Further, the solar cell of Example 2 had an energy conversion efficiency of 17%. Still further, though the p-type Cu(Ga,In)Se$_2$ crystal used in the solar cell of Example 2 was a polycrystal, the solar cell of Example 2 had a n value (diode index) of 1.5, which is equal to that in the case where the crystal used therein is a single crystal.

Example 3

An example of the above-described solar cell according to Embodiment 3 is described below as Example 3. It should be noted that FIGS. 2 and 5A to 5C are referred to. The solar cell of Example 3 shown in FIG. 2 was configured so that the substrate 21 was a soda lime glass substrate, the conductive film 22 was a Mo film, the p-type semiconductor crystal of the compound semiconductor layer 23 was a chalcopyrite-structured p-type Cu(Ga,In)Se$_2$ crystal, the n-type impurity doped in the high-resistance parts 23B was Zn, the n-type window layer 24 was a n-type ZnMgO film, and the n-type transparent conductive film 25 was an ITO film. The resistance of the high-resistance parts 23 was set to be higher than the resistance of the n-type ZnMgO film. Further, the ITO film was formed so as to be connected with the low-resistance part 23A via substantially only at least one of the n-type ZnMgO film and the high-resistance parts 23B.

The solar cell of Example 3 was produced in the following manner. First, as shown in FIG. 5A, the Mo film with a film thickness of approximately 400 nm as the conductive film 22 was formed on the soda lime glass substrate as the substrate 21 by sputtering or the like. The Mo film had a sheet resistance of approximately 0.5Ω/□. Next, as shown in FIG. 5A, the chalcopyrite-structured p-type Cu(Ga,In)Se$_2$ crystal as the p-type semiconductor crystal 33 was grown on the Mo film by vapor deposition, at a film formation rate of 1 μm/min. until the film had a thickness of approximately 2 μm in average. The p-type Cu(Ga,In)Se$_2$ crystal had an uneven surface. Next, as shown in FIG. 5A, the n-type ZnMgO film as the n-type window layer 24 was formed on the p-type Cu(Ga,In)Se$_2$ crystal so as to have a film thickness of approximately 100 nm by sputtering. Since the p-type Cu(Ga,In)Se$_2$ crystal had an uneven surface, the pinholes 29 (apertures) were formed in the n-type ZnMgO film. The pinholes 29 were formed substantially in the vicinities of recessed portions of the uneven surface of the p-type Cu(Ga,In)Se$_2$ crystal.

Next, as shown in FIG. 5B, Zn$^+$ ions (n-type impurity ions) were implanted in the p-type Cu(Ga,In)Se$_2$ crystal via the pinholes 29 in the n-type ZnMgO film, from the side where the n-type ZnMgO film was formed, until the dose amount became in a range of $5\times10^{15}/cm^2$ to $5\times10^{16}/cm^2$. With this, the ion-implanted parts 56B containing Zn were formed in the p-type Cu(Ga,In)Se$_2$ crystal.

Next, the stack provided with the p-type Cu(Ga,In)Se$_2$ crystal including the ion-implanted parts 56B and the non-ion-implanted part 56A in which the impurity ions were not implanted was annealed (heat treatment) at a substrate temperature of 170° C. for 20 minutes, so that Zn thus implanted therein was diffused in the p-type Cu(Ga,In)Se$_2$ crystal. By so doing, the compound semiconductor layer 23 that included the high-resistance parts 23B containing Zn and the low-resistance part 23A not containing Zn diffused from the Zn film was formed. This annealing also allowed the p-type Cu(Ga,In)Se$_2$ crystal to be restored from damage that occurred upon the ion implantation.

Next, as shown in FIG. 2, the n-type transparent conductive film 25 was formed by sputtering on the n-type ZnMgO film and on surfaces of the high-resistance parts 23B. With this, the production of the solar cell of Example 3 was completed.

The shunt resistor 1 (see FIG. 1) of an equivalent circuit of the solar cell of Example 3 had a resistance of approximately 2 k$\Omega\cdot$cm$^2$, which was approximately 5 times the resistance of a solar cell according to a comparative example produced by the same method as that for the solar cell of Example 3 except that the step of implanting Zn ions and the annealing step were not carried out, the comparative example accordingly being characterized in that Zn was not contained in the high-resistance parts 23B. Further, the solar cell of Example 3 had an energy conversion efficiency of 17%. Still further, though the p-type Cu(Ga,In)Se$_2$ crystal used in the solar cell of Example 3 was a polycrystal, the solar cell of Example 3 had a n value (diode index) of 1.5, which is equal to that in the case where the crystal used therein is a single crystal.

INDUSTRIAL APPLICABILITY

The present invention is applicable for improving an energy conversion efficiency of a solar cell by increasing a resistance of a shunt resistor of an equivalent circuit of the solar cell. Further, the present invention is applicable for improving the manufacturability of the solar cell.

The invention claimed is:

1. A solar cell comprising:
a substrate;
a conductive film formed on the substrate;
a compound semiconductor layer formed on the conductive film, the compound semiconductor layer including a p-type semiconductor crystal containing an element of Group Ib, an element of Group IIIb, and an element of Group VIb;
a n-type window layer formed on the compound semiconductor layer, the n-type window layer having an aperture; and
a n-type transparent conductive film formed on the n-type window layer and on a portion of the compound semiconductor layer at the aperture of the n-type window layer,
wherein
the compound semiconductor layer includes a high-resistance part, the high-resistance part being located in a portion of the compound semiconductor layer in the vicinity of a surface thereof on a side opposite to the conductive film, the high-resistance part containing a n-type impurity doped in the p-type semiconductor crystal, and
the high-resistance part is located under the aperture of the n-type window layer.

2. The solar cell according to claim 1, wherein
the high-resistance part has a resistance higher than a resistance of the n-type window layer.

3. The solar cell according to claim 1, wherein
the compound semiconductor layer has a recessed surface on its face on the side opposite to the conductive film, and
the high-resistance part is formed in the vicinity of the recessed surface.

4. The solar cell according to claim 1, wherein
the n-type transparent conductive film is connected with a part of the compound semiconductor layer other than the high-resistance part only via at least either one of the n-type window layer and the high-resistance part.

5. The solar cell according to claim 1, wherein
the high-resistance part contains, as the n-type impurity, at least one element selected from the group consisting of the elements of Group IIa and the elements of Group IIb.

6. The solar cell according to claim 1, wherein
the n-type impurity of the high-resistance part is Zn, Mg, or Ca.

7. The solar cell according claim 1, wherein
the p-type semiconductor crystal of the compound semiconductor layer is a chalcopyrite-structured CuInSe$_2$ crystal, a chalcopyrite-structured Cu(Ga,In)Se$_2$ crystal, or a chalcopyrite-structured CuIn(S,Se)$_2$ crystal.

8. The solar cell according to claim 1, wherein
the n-type window layer is a ZnO film or a ZnMgO film.

9. The solar cell according to claim 1, further comprising:
a n-type buffer layer formed between the compound semiconductor layer and the n-type window layer, the n-type buffer layer having an aperture that is connected with the aperture of the n-type window layer.

10. The solar cell according to claim 9, wherein
the n-type buffer layer is a Zn(O,OH) film or a Zn(O,S,OH) film.

11. The solar cell according to claim 1, wherein
the n-type transparent conductive film is an ITO film, a SnO$_2$ film, an In$_2$O$_3$ film, a ZnO:Al film, or a ZnO:B film.

12. The solar cell according to claim 1, wherein
the substrate is a glass substrate containing at least one alkali metal element selected from the group consisting of Na, K, and Li, and
a difference between a coefficient of linear expansion of the substrate and a coefficient of linear expansion of the p-type semiconductor crystal is within a range of not less than $1\times10^{-6}$/K and not more than $3\times10^{-6}$/K.

13. A solar cell producing method comprising the steps of:
forming a conductive film on a substrate;
growing a p-type semiconductor crystal on the conductive film, the p-type semiconductor crystal containing an element of Group Ib, an element of Group IIIb, and an element of Group VIb;
forming a n-type window layer on the p-type semiconductor crystal, the n-type window layer having an aperture; and
forming a n-type transparent conductive film on the n-type window layer and on a portion of the p-type semiconductor crystal at the aperture of the n-type window layer,
the solar cell producing method further comprising the step of doping an n-type impurity in the p-type semiconductor crystal, in the vicinity of a surface of the p-type semiconductor crystal under the aperture of the n-type window layer, the doping step being carried out between the step of forming the n-type window layer and the step of forming the n-type transparent conductive film.

14. The solar cell producing method according to claim 13, wherein
in the step of doping the n-type impurity in the p-type semiconductor crystal, an impurity film is formed by depositing the n-type impurity by a vapor deposition method or an evaporation method on the n-type window layer and the portion of the p-type semiconductor crystal that is exposed at the aperture of the n-type window layer, and the n-type impurity in the impurity film is diffused by a heat treatment into the portion of the p-type semiconductor crystal.

15. The solar cell producing method according to claim 13, wherein
in the step of doping the n-type impurity in the p-type semiconductor crystal, an impurity film is formed by depositing the n-type impurity by plating on the portion of the p-type semiconductor crystal that is exposed at the aperture of the n-type window layer, and the n-type impurity in the impurity film is diffused by a heat treatment into the portion of the p-type semiconductor crystal.

16. The solar cell producing method according to claim 14, further comprising the step of removing the impurity film, the step of removing the impurity film being carried out between the step of doping the n-type impurity in the p-type semiconductor crystal and the step of forming the n-type transparent conductive film.

17. The solar cell producing method according to claim 15, further comprising the step of removing the impurity film, the step of removing the impurity film being carried out between the step of doping the n-type impurity in the p-type semiconductor crystal and the step of forming the n-type transparent conductive film.

18. The solar cell producing method according to claim 13, wherein in the step of doping the n-type impurity in the p-type semiconductor crystal, the n-type impurity is implanted by ion implantation into the portion of the p-type semiconductor crystal via the aperture of the n-type window layer.

19. The solar cell producing method according to claim 18, wherein in the step of doping the n-type impurity in the p-type semiconductor crystal, a heat treatment is carried out additionally, after the n-type impurity is implanted.

20. The solar cell producing method according to claim 13, further comprising the step of forming a n-type buffer layer having an aperture, the step of forming the n-type buffer layer being carried out between the step of growing the p-type semiconductor crystal and the step of forming the n-type window layer.

* * * * *